United States Patent

Ohara

[11] Patent Number: 5,614,767
[45] Date of Patent: Mar. 25, 1997

[54] ALIGNMENT ACCURACY CHECK PATTERN

[75] Inventor: Shinji Ohara, Tokyo, Japan

[73] Assignee: NEC Corporation, Tokyo, Japan

[21] Appl. No.: 648,673

[22] Filed: May 16, 1996

Related U.S. Application Data

[63] Continuation of Ser. No. 350,544, Dec. 7, 1994, abandoned.

[30] Foreign Application Priority Data

Dec. 10, 1993 [JP] Japan ................................. 5-310526

[51] Int. Cl.$^6$ .......................... H01L 23/48; H01L 27/11; H01L 29/46
[52] U.S. Cl. .................. 257/797; 257/758; 257/765; 257/740; 257/774
[58] Field of Search .................................. 257/797, 758, 257/773, 774, 765, 740, 771, 332

[56] References Cited

U.S. PATENT DOCUMENTS

| | | | |
|---|---|---|---|
| 4,800,176 | 1/1989 | Kakumu et al. | 257/765 |
| 5,103,287 | 4/1992 | Mase et al. | 257/775 |
| 5,184,205 | 2/1993 | Shibata | 257/765 |
| 5,308,682 | 5/1994 | Morikawa | 257/797 |
| 5,323,047 | 6/1994 | Nguyen | 257/774 |
| 5,331,170 | 7/1994 | Hayashi et al. | 257/377 |
| 5,414,297 | 5/1995 | Morita et al. | 257/797 |

FOREIGN PATENT DOCUMENTS

| | | | |
|---|---|---|---|
| 1-241118 | 9/1989 | Japan . | |
| 0138920 | 6/1991 | Japan | 257/797 |

*Primary Examiner*—Sara W. Crane
*Assistant Examiner*—Alexander Oscar Williams
*Attorney, Agent, or Firm*—Young & Thompson

[57] ABSTRACT

An alignment accuracy check pattern includes a contact hole formed in an insulating film on a major surface of a semiconductor substrate in a region different from an element region, and a photoresist for patterning which is formed in at least part of the contact hole. A wiring layer is formed under the insulating film, and another insulating film is formed under the wiring layer.

4 Claims, 8 Drawing Sheets

ALIGNMENT ACCURACY CHECK PATTERN

This application is a continuation of application Ser. No. 08/350,544, filed Dec. 7, 1994, now abandoned.

BACKGROUND OF THE INVENTION

1. Field of the Invention

The present invention relates to a pattern for checking the alignment accuracy of a wiring pattern used in manufacturing a semiconductor device.

2. Description of the Related Art

In manufacturing a semiconductor device, a reduction projection exposure apparatus is used to pattern a photoresist film. At this time, a relative position between a certain pattern formed on a semiconductor substrate in the preceding process and a mask pattern formed on the photoresist film by the reduction projection exposure apparatus must be measured to calculate a misalignment amount. For example, when an aluminum wiring layer is to be patterned on an insulating interlayer having a contact hole, a photoresist is coated on the entire surface of the aluminum film and exposed, thereby leaving the photoresist in only a region subjected to patterning. At this time, the exposure position is determined in accordance with a mark provided on the substrate. However, even when alignment is performed with reference to the mark, the patterned photoresist is actually misaligned in some cases. Such misalignment cannot be detected in a region where an element such as a transistor is formed. Therefore, a region for detecting this misalignment is provided in addition to the area where the element such as a transistor is formed, and an alignment accuracy check pattern is formed in this region. The principle of detection of a misalignment amount will be described below with reference to FIG. 1.

Figure 1:
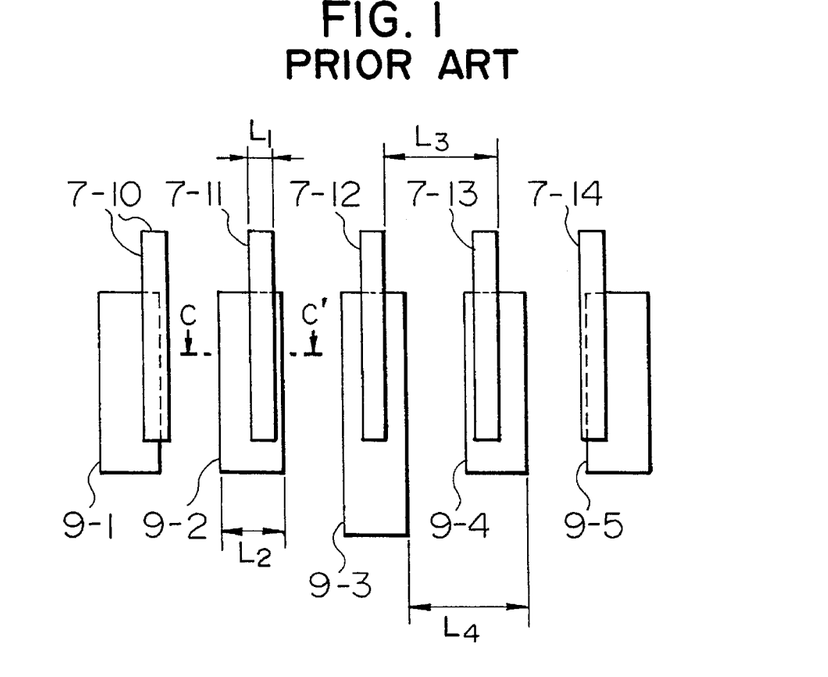
FIG. 1 is a schematic plan view for explaining the principle of alignment accuracy check.

Referring to FIG. 1, reference numerals 9-1, 9-2, 9-3, 9-4, and 9-5 (to be referred to as "9" hereinafter if any specific pattern need not be indicated) denote patterns formed on a substrate. Reference numerals 7-10, 7-11, 7-12, 7-13, and 7-14 (to be referred to as "7" hereinafter if any specific patterned photoresist need not be indicated) denote photoresists patterned on the patterns 9. Assume that the photoresists 7 have a pattern width L1 of 1.5 μm, the patterns 9 have a pattern width L2 of 3.0 μm, and a difference between a pattern pitch L3 of the photoresists 7 and a pattern pitch L4 of the patterns 9 is 0.05 μm, i.e., L4=L3+0.05 μm. In this case, the pattern pitch L3 of the photoresists 7 is shorter than the pattern pitch L4 of the patterns 9. Therefore, only one photoresist 7 has its central line matching with the central line of the corresponding pattern 9. FIG. 1 shows a case wherein only the central photoresist 7-12 has the central line matching with the central line of the corresponding pattern 9. In this case, misalignment is not detected. If the photoresist 7-13 has the central line matching with the central line of the corresponding pattern 9, misalignment in an amount of 0.05 μm in the right direction is detected. Similarly, if the photoresist 7-14 has the central line matching with the central line of the corresponding pattern 9, misalignment in an amount of 0.1 μm in the right direction is present.

A conventional alignment accuracy check pattern will be described below with reference to FIG. 2.

Figure 2:
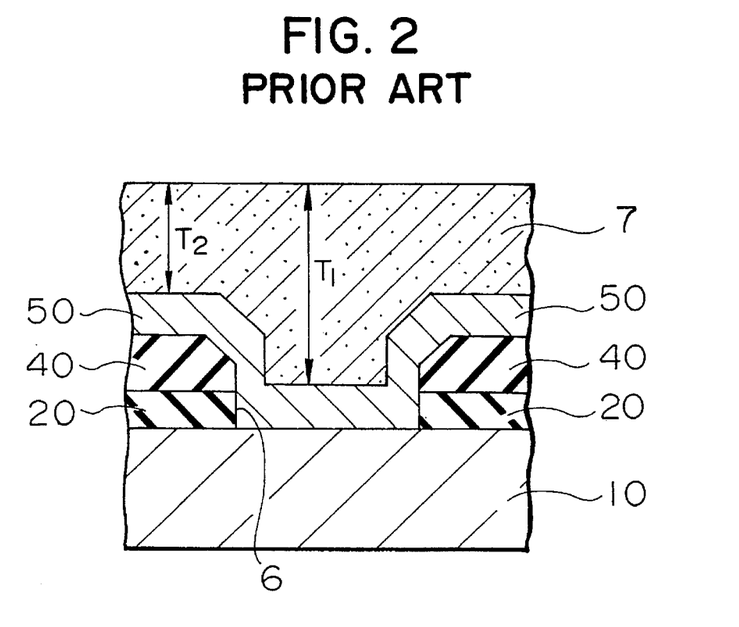
FIG. 2 is a sectional view showing a prior art.

FIG. 2 is a sectional view showing a misalignment check pattern and corresponding to a sectional view taken along a line C–C' in FIG. 1 before patterning. Referring to FIG. 2, reference numeral 10 denotes a semiconductor substrate. A first insulating interlayer 20 consisting of a silicon oxide film or the like is used to insulate an element from a polysilicon wiring layer in an element formation region. In the element region, a first wiring layer consisting of polysilicon is formed on the first insulating interlayer 20. In a region used for an alignment accuracy check pattern, however, such a polysilicon wiring layer is not formed because no element such as a transistor is formed, as a matter of course. A second insulating interlayer 40 is used to insulate the polysilicon layer serving as the first wiring layer from an aluminum wiring layer 50 serving as a second wiring layer in the element region. Like the first insulating interlayer, the second insulating interlayer 40 consists of silicon oxide or the like. As described above, no polysilicon film serving as the first wiring layer is present in this region, so the second insulating interlayer 40 is directly formed on the first insulating interlayer 20. A contact hole 6 is formed in the first and second insulating interlayers 20 and 40. This contact hole 6 reaches the semiconductor substrate 10. The contact hole 6 corresponds to the pattern 9-2 in FIG. 1. In the element region, such a contact hole is formed to connect the first and second wiring layers with each other, so it is sufficient to etch only the second insulating interlayer 40. However, in formation of a contact hole, overetching is normally caused. That is, etching is continuously performed after the wiring layer immediately under the insulating interlayer 40 is etched because variations in thickness of the insulating interlayer must be taken into consideration. Of course, in the element region, even when overetching is performed to the wiring layer immediately under the insulating layer, the wiring layer is not etched. This is because the etching rate of the insulating interlayer has a large difference from that of the wiring layer. If a wiring layer is present, it serves as an etching stopper. However, since no wiring layer is formed in the region used for an alignment accuracy check pattern, as described above, the contact hole 6 reaches the semiconductor substrate 10, as shown in FIG. 2. In most popular anisotropic dry etching, almost all types of insulating layers have almost the same etching rate. For this reason, even if the first insulating interlayer 20 and the second insulating interlayer 40 do not consist of the same material, overetching is caused. In addition, the second wiring layer 50 consisting of aluminum is deposited on the entire surface of the chip with the contact hole 6, and the photoresist 7 is deposited on the entire surface of the second wiring layer 50. In this state, the exposure position is set in accordance with a mark, and exposure is then performed. The resist 7 is removed while leaving the mask portion, and a pattern having the central line of the contact hole 6 matching with that of the photoresist 7 is checked using a microscope or the like. With this operation, a misalignment amount between the pattern of the contact hole and the photoresist pattern used for patterning of the aluminum wiring layer can be detected on the order of 0.05 μm.

Figure 3:
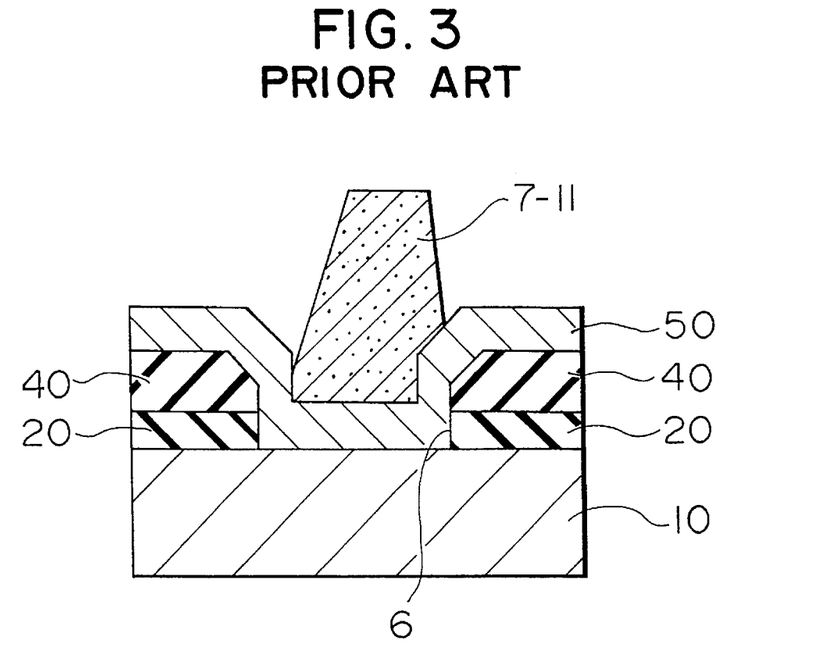
FIG. 3 is a sectional view showing the prior art after patterning of a resist film.
Figure 4:
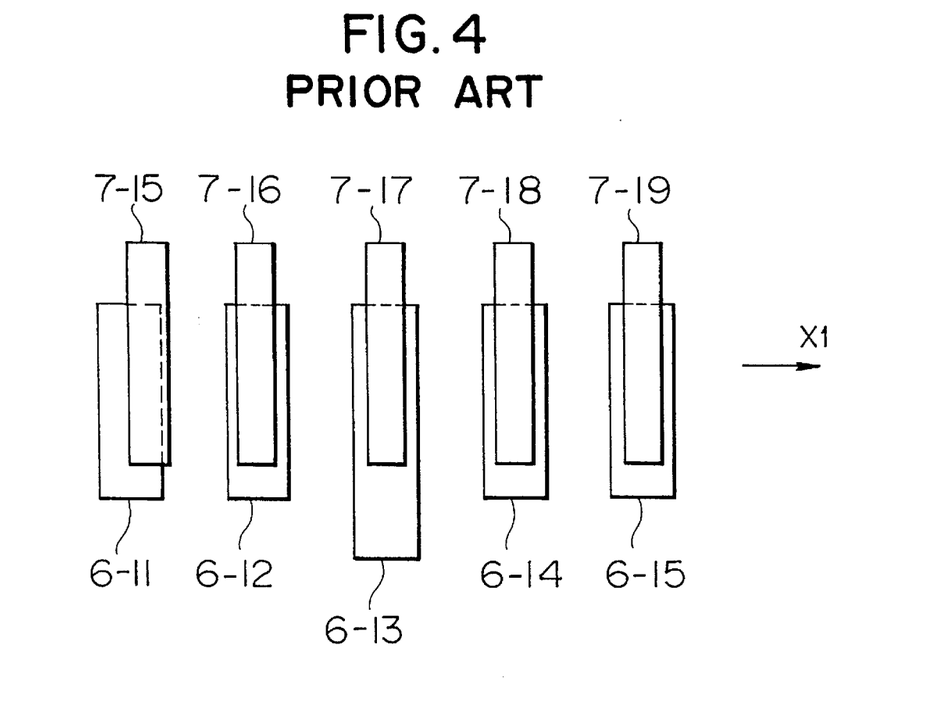
FIG. 4 is a plan view schematically showing a positional relationship between a contact hole and a resist pattern in the prior art.

Normally, in a semiconductor device, all contact hole portions in a region except for the alignment accuracy check pattern region are covered by the aluminum wiring layer, and no aluminum pattern is formed in the contact hole. Therefore, the exposure conditions of a reduction projection exposure apparatus may be set while only a thickness $T_2$ of the photoresist in FIG. 2 is taken into consideration. On the other hand, in the alignment accuracy check pattern, a portion where the photoresist has a thickness $T_1$ must be patterned to leave the pattern of the aluminum film 50 in the contact hole 6 in FIG. 2. However, since the contact hole 6 has a large depth as described above, the thickness $T_1$ of the photoresist in the contact hole 6 becomes much larger than the thickness $T_2$ outside the contact hole after the photoresist film is coated in the conventional alignment accuracy check pattern, as shown in FIG. 2. In this case, a standing-wave effect due to interference between incident light and reflected light appears because of the high reflectance of the aluminum film 50. This effect largely depends on the thickness of the resist. For this reason, when the thickness $T_2$ changes to the thickness $T_1$, the shape of the photoresist largely changes accordingly. In general, a photoresist having a smaller thickness can be more accurately patterned. Because of these influences, the photoresist film of the alignment accuracy check pattern has a largely tapered pattern shape, as indicated by the photoresist 7 in FIG. 3. FIG. 3 is a sectional view showing a case wherein the photoresist 7-11 is patterned to be slightly shifted in the right direction from the central line of the contact hole 6. FIG. 3 corresponds to the sectional view taken along the line C–C' in FIG. 1 after patterning and shows a portion where the thickness of the photoresist 7-11 is large, i.e., a state wherein the photoresist 7-11 is left in the contact hole 6. Assume that the misalignment amount of the photoresist film is to be checked by using the alignment accuracy check pattern having a shape shown in FIG. 3. As shown in FIG. 4, in all patterns (7-15 to 7-19), the photoresist tends to be left in the contact hole 6. For example, if the misalignment amount of the photoresist film 7 is 0.05 μm in a $X_1$ direction with respect to the contact hole 6, misalignment in the $X_1$ direction can be detected from the appearance of the leftmost pattern. However, the remaining patterns appear to have the same misalignment amount, so the misalignment amount cannot be calculated. The conventional alignment accuracy check pattern poses the most serious problem when an upper wiring layer is to be aligned with a deep contact hole.

SUMMARY OF THE INVENTION

The present invention has been made in consideration of the above situation in the prior art, and has as its object to provide an alignment accuracy check pattern having a high accuracy.

In order to achieve the above object, according to the first aspect of the present invention, there is provided an alignment accuracy check pattern comprising a contact hole formed in an insulating film on a major surface of a semiconductor substrate in a region different from an element region, and a photoresist for patterning which is formed in at least part of the contact hole, wherein a wiring layer is formed under the insulating film, and another insulating film is formed under the wiring layer.

According to the second aspect of the present invention, there is provided an alignment accuracy check pattern wherein the region different from the element region described in the first aspect comprises a plurality of regions where each alignment accuracy check pattern is formed in a specific region for each patterning process, and the wiring layer is formed on an entire surface of a region other than the specific region.

According to the third aspect of the present invention, there is provided an alignment accuracy check pattern wherein the wiring layer described in the first and second aspects is a polysilicon layer.

According to the present invention, the depth of the contact hole used as an alignment accuracy check pattern can be decreased as compared to the prior art. For this reason, the photoresist film for patterning of a conductive film used for wiring can obtain a sharp edge. Therefore, a misalignment amount can be accurately checked as compared to the prior art.

In addition, the contact hole is formed in an insulating interlayer formed on a conductive film such as a polysilicon film. Therefore, the edge shape of the photoresist film can be improved, and the misalignment amount can be more accurately obtained.

The above and other advantages, features and additional objects of the present invention will become manifest to those versed in the art upon making reference to the following detailed description and accompanying drawings in which preferred embodiments incorporating the principle of the present invention are shown by way of illustrative examples.

DETAILED DESCRIPTION OF THE PREFERRED EMBODIMENTS

Figure 5:
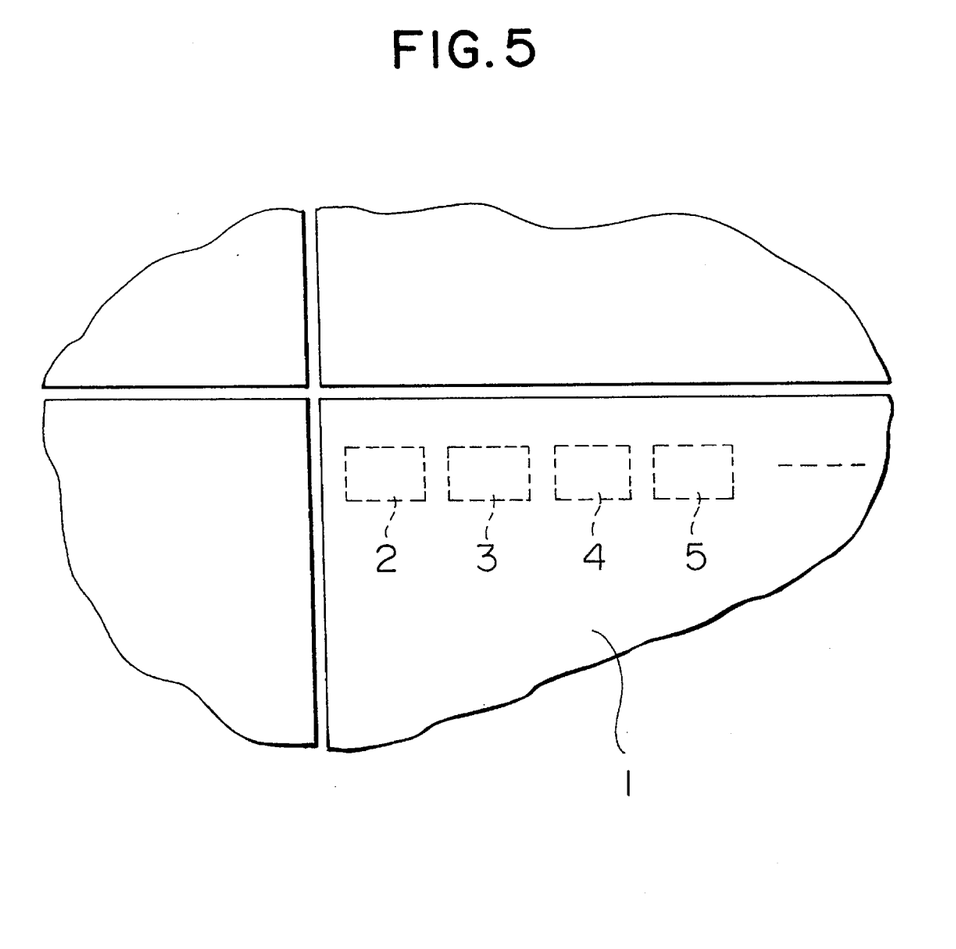
FIG. 5 is a plan view schematically showing a formation region for an alignment accuracy check pattern of the present invention.
Figure 6:
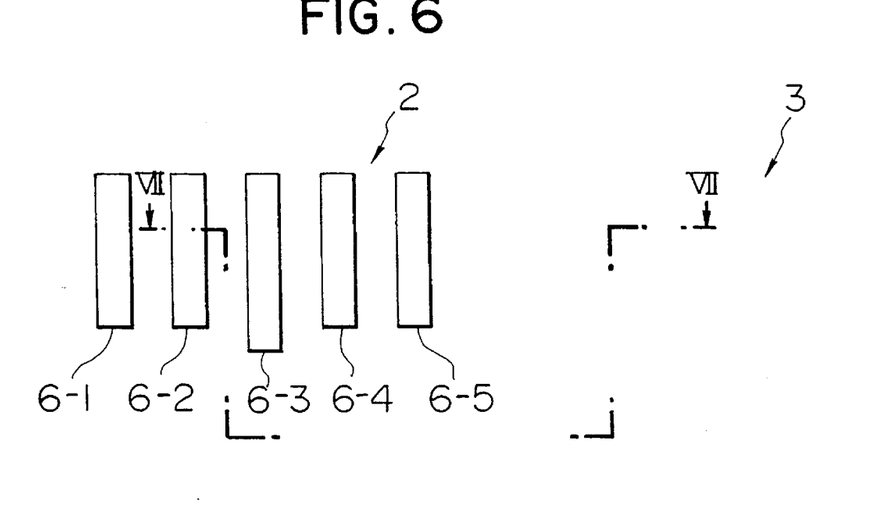
FIG. 6 is a plan view schematically showing one of the steps in manufacturing an alignment accuracy check pattern according to the first embodiment of the present invention.
Figure 7:
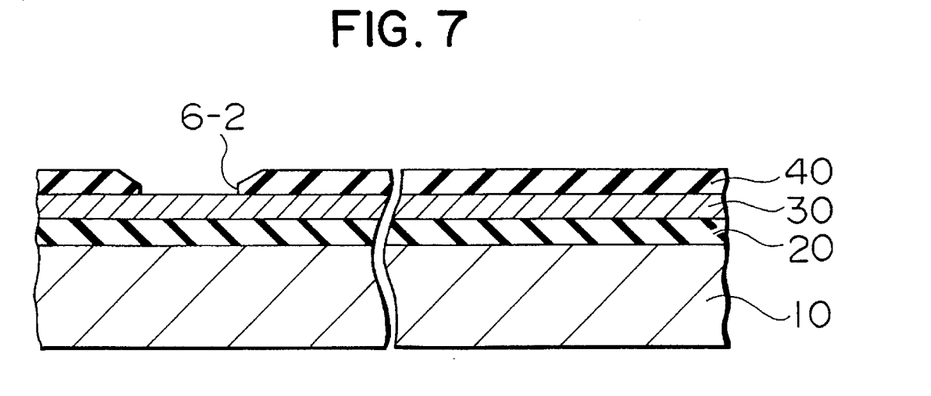
FIG. 7 is a sectional view taken along a line VII—VII in FIG. 6.

The present invention will be described in detail with reference to the accompanying drawings. FIG. 5 is a plan view showing a region subjected to formation of a check pattern of the present invention. Reference numeral 1 denotes a semiconductor device. Regions 2 to 5 on the semiconductor device 1 are check pattern formation regions. Since each region is used for each patterning, there are regions corresponding to the number of times of patterning. FIG. 6 is a plan view showing an embodiment of the present invention, and FIG. 7 is a sectional view taken along a line VII—VII in FIG. 6. The region 2 is a region where an alignment accuracy check pattern is formed, and the region 3 is a region where an alignment accuracy check pattern is to be formed in the next patterning process. Contact holes 6-1, 6-2, 6-3, 6-4, and 6-5 are formed in the region 2 while no contact hole is formed in the region 3.

Referring to FIG. 7, reference numeral 10 denotes a semiconductor substrate. In an element formation region, an element such as a transistor is formed. A first insulating interlayer 20 consisting of silicon oxide is formed to insulate the element region from a wiring layer. A polysilicon layer 30 serves as a first wiring layer. Since no element such as a transistor is formed in a region where an alignment accuracy check pattern is formed, the polysilicon film is conventionally removed from this region. In this embodiment, however, the polysilicon film is formed in both the regions 2 and 3. A second insulating interlayer 40 consisting of silicon oxide is formed to insulate wiring layers from each other. The contact hole 6-2 is formed in the insulating interlayer 40 so as to have a depth smaller than that of the prior art. The reason for this is as follows. The wiring layer consisting of polysilicon or the like is not etched at the etching rate of the insulating layer. Therefore, since the polysilicon layer 30 is present, even overetching is stopped at the polysilicon layer 30.

Figure 8:
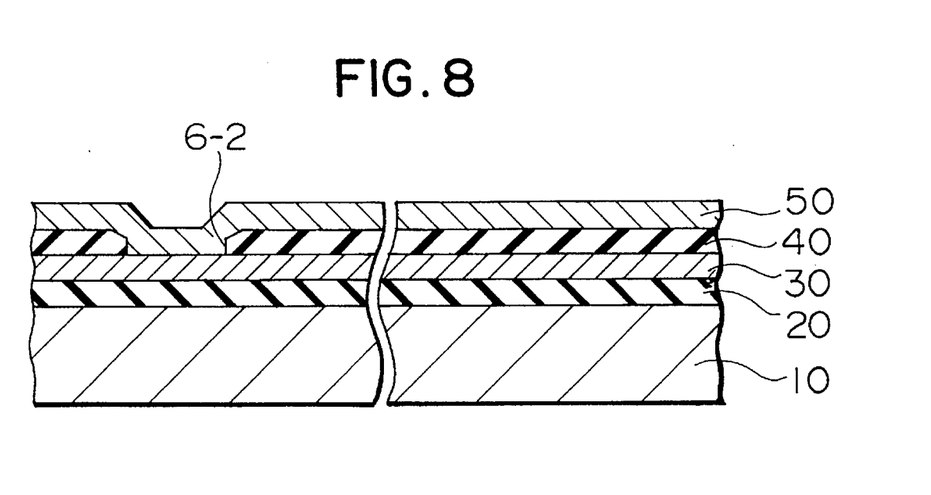
FIG. 8 is a sectional view showing another one of the steps in manufacturing the alignment accuracy check pattern according to the first embodiment of the present invention.
Figure 9:
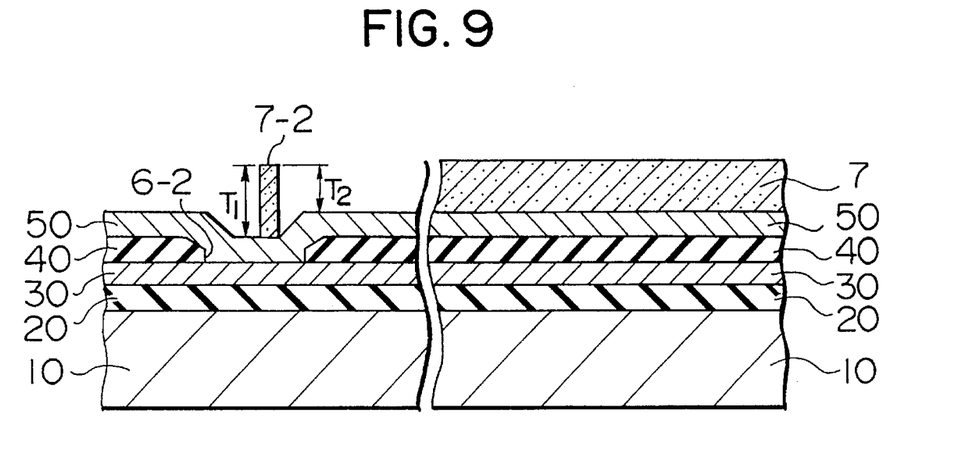
FIG. 9 is a sectional view showing still another one of the step in manufacturing the alignment accuracy check pattern according to the first embodiment of the present invention.
Figure 10:
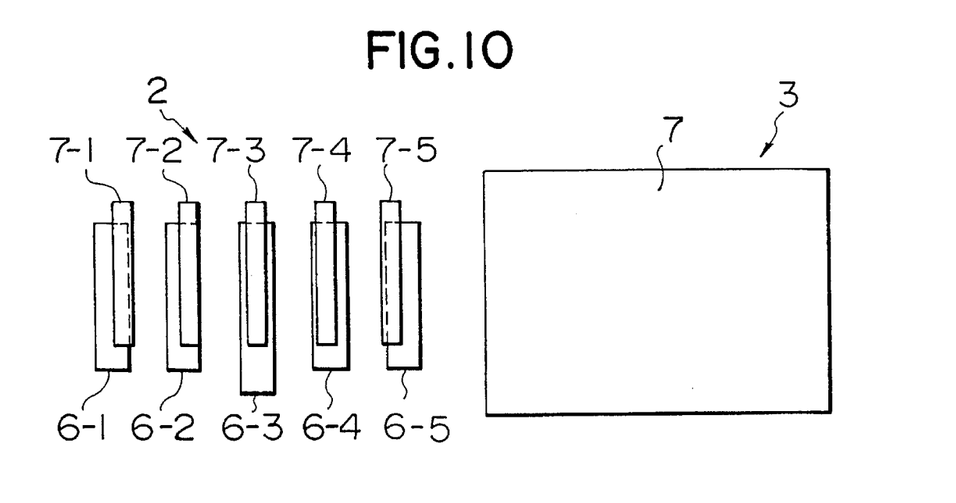
FIG. 10 is a schematic plan view corresponding to a state shown in FIG. 9.

FIG. 8 is a sectional view in which an aluminum film 50 serving as a second wiring layer is formed by sputtering or the like. FIG. 9 is a sectional view in which a photoresist 7 is coated on the resultant structure and patterned. As shown in FIG. 9, although a thickness $T_1$ of the photoresist 7 patterned on the contact hole 6-2 is larger than a thickness $T_2$ at the remaining portion, a difference therebetween is largely decreased as compared to the prior art because of the shallow contact hole 6-2. More specifically, the thickness $T_1$ is largely decreased to be as small as about 2.3 μm in this embodiment while it is about 3 μm in the prior art. On the other hand, the thickness $T_2$ is kept unchanged at about 2 μm in both the prior art and this embodiment. For this reason, the difference between the thicknesses $T_1$ and $T_2$ is greatly reduced. Therefore, even when the exposure conditions of a reduction projection exposure apparatus in patterning of the photoresist film 7 are set to be optimum at a portion where the photoresist film 7 has the thickness $T_2$, the photoresist film 7-2 can keep a sharp shape even in the contact hole 6-2 because a deviation amount from the optimum exposure conditions for the photoresist film in the contact hole has a larger margin. FIG. 10 is a plan view corresponding to FIG. 9. As is apparent from FIG. 10, the patterned photoresist 7 does not become dull, as shown in FIG. 4, and a sharp contrast can be obtained at the edge portion, so a misalignment amount can be easily read.

At this time, the photoresist 7 is left on the entire surface of the region 3. Therefore, when the photoresist 7 is used as a mask to pattern the aluminum film 50 by the etching process, the aluminum film 50 is left on the entire surface of the region 3. Also in the region 2, the aluminum film 50 is left at a portion where the photoresist 7 is left upon patterning process. This aluminum film 50 is not used, and the region 2 is not used anymore after misalignment is measured, as a matter of course. By performing the same process in the region 3, misalignment can be accurately measured also in the subsequent patterning processes. FIGS. 11 to 14 show these processes.

Figure 11:
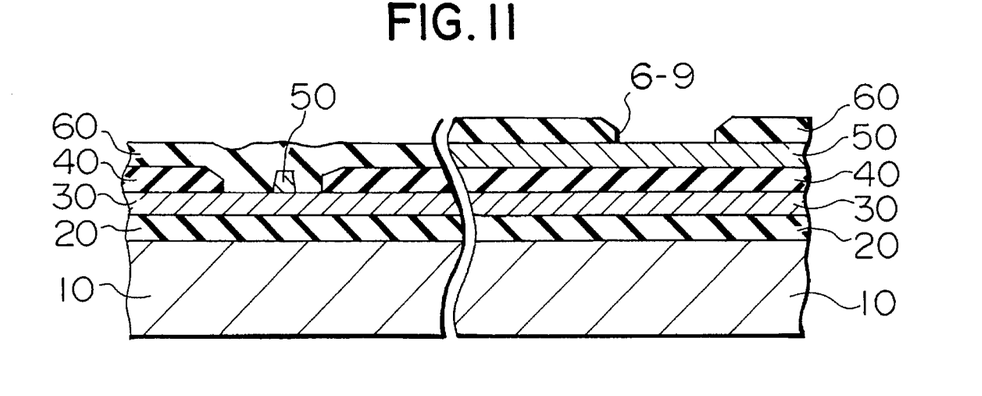
FIG. 11 is a sectional view showing another one of the steps in manufacturing the alignment accuracy check pattern according to the first embodiment of the present invention.
Figure 12:
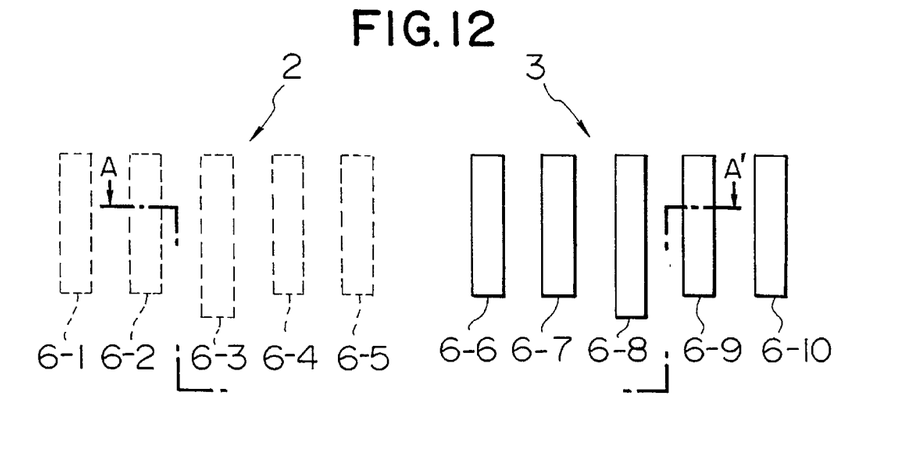
FIG. 12 is a schematic plan view corresponding to a state shown in FIG. 11.
Figure 13:
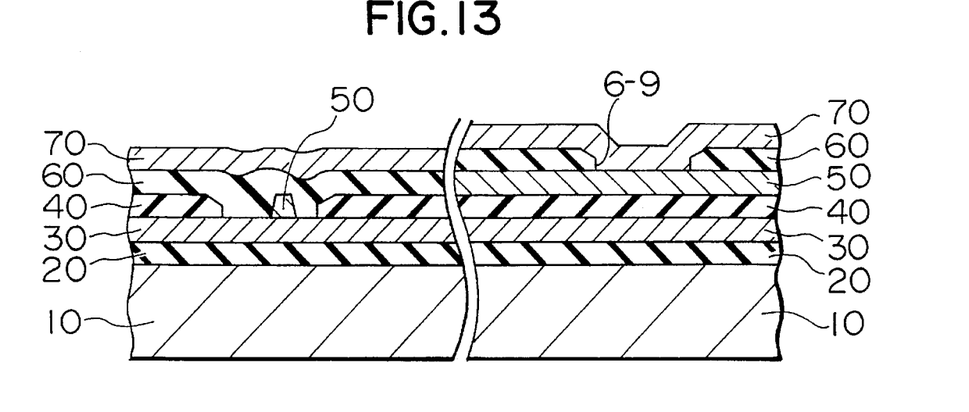
FIG. 13 is a sectional view showing still another one of the steps in manufacturing the alignment accuracy check pattern according to the first embodiment of the present invention.
Figure 14:
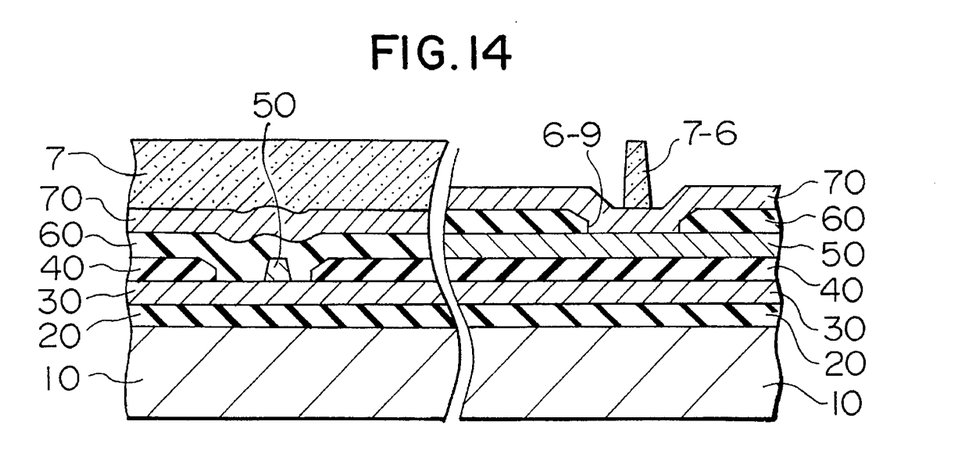
FIG. 14 is a sectional view showing still another one of the steps in manufacturing the alignment accuracy check pattern according to the first embodiment of the present invention.

FIG. 11 is a sectional view in which a third insulating interlayer 60 consisting of silicon oxide is formed on the patterned aluminum film 50, and a contact hole 6-9 is formed therein. FIG. 12 is a plan view corresponding to FIG. 11. In the region 2 used for misalignment measurement in the preceding process, small three-dimensional patterns are formed on the surface of the third insulating interlayer 60 at the contact hole portion or a portion where the patterned aluminum film 50 is present below. However, since the region 2 is not used anymore, the subsequent processes are not influenced at all. FIG. 13 is a sectional view showing a state wherein an aluminum film 70 serving as a third wiring layer is formed on the third insulating interlayer 60. FIG. 14 is a sectional view showing a state wherein the photoresist 7 is coated on the aluminum film 70 and patterned. As described above, the aluminum film 50 is left on the entire surface of the region 3. For this reason, as in the preceding patterning process, the contact hole 6-9 becomes shallow because of the presence of the aluminum film 50, and the edge of a photoresist 7-6 formed on the contact hole 6-9 becomes sharp. Therefore, misalignment can be accurately measured. When the entire surface of the region 4 (not shown in FIG. 14) is also masked with the photoresist 7, misalignment can be accurately measured in the subsequent patterning process, as a matter of course.

In this embodiment, misalignment in the lateral direction is accurately detected by making the edge of the photoresist 7 sharp. However, this method can also be applied to misalignment detection in the longitudinal direction, as a matter of course. This application is made in the second embodiment.

Figure 15:
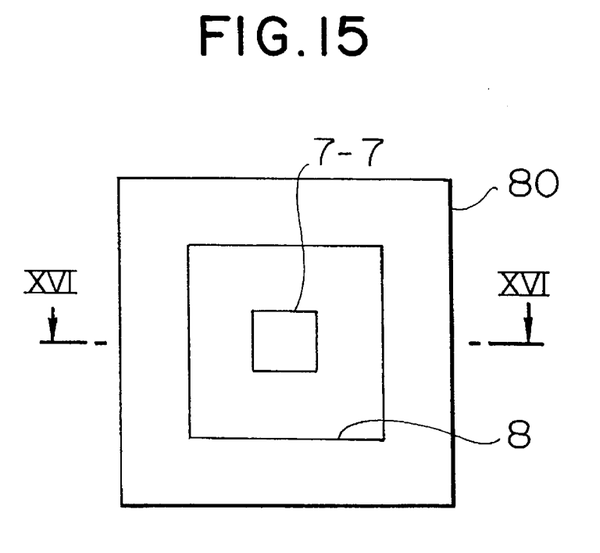
FIG. 15 is a plan view schematically showing the second embodiment of the present invention.

The second embodiment will be described below with reference to FIGS. 15 and 16. FIG. 15 is a plan view showing the second embodiment of the present invention, and FIG. 16 is a sectional view taken along a line XVI—XVI in FIG. 15.

Figure 16:
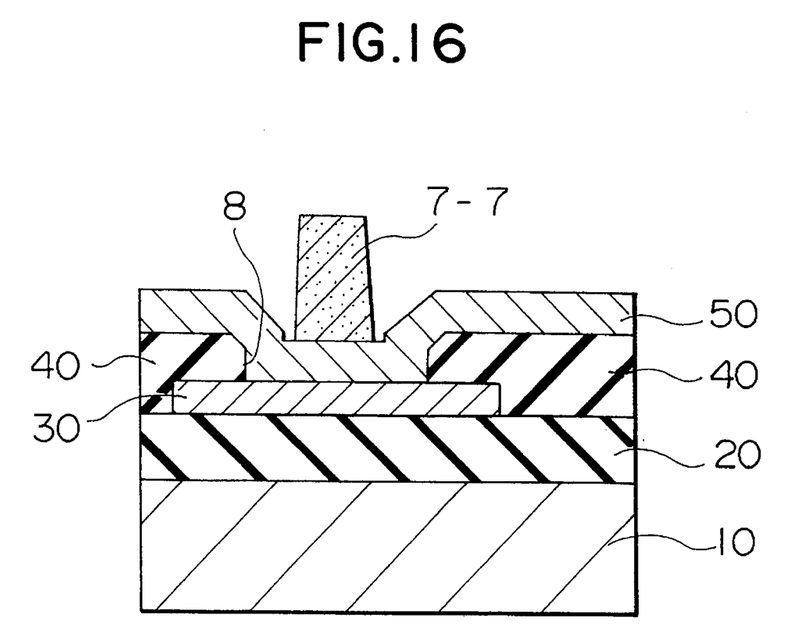
FIG. 16 is a sectional view showing the second embodiment of the present invention.

Referring to FIG. 16, as in the first embodiment, reference numeral 10 denotes a silicon semiconductor substrate; 20, a first insulating interlayer; 30, a polysilicon film; 40, a second insulating interlayer; 8, a contact hole formed in the second insulating interlayer 40; and 50, an aluminum film. Reference numeral 7-7 denotes a photoresist film for patterning of the aluminum 50. In the first embodiment, the misalignment amount of the alignment accuracy check pattern must be directly read by an operator. In a box pattern shown in FIG. 15, however, a relative misalignment between the photoresist 7-7 and the contact hole 8 can be mechanically calculated by applying a known image processing technique. Even in this box pattern, if a pattern is to be formed by the conventional method, a photoresist pattern must be formed in the contact. For this reason, a deviation amount from the optimum exposure conditions of a reduction projection exposure apparatus is generated, so the photoresist pattern in the contact has a large taper angle. This degrades the contrast at the edge portion of the photoresist film, resulting in difficulty in reading an accurate misalignment amount.

To the contrary, in the box pattern using the present invention, as shown in FIG. 16, the polysilicon film 30 is formed at the opening portion of the contact hole 8. With this structure, the contact hole 8 becomes shallow to decrease the deviation amount from the optimum exposure conditions of the reduction projection exposure apparatus. Therefore, the edge portion of the photoresist film 7-7 becomes sharp, so the misalignment amount can be easily obtained.

Figure 17:
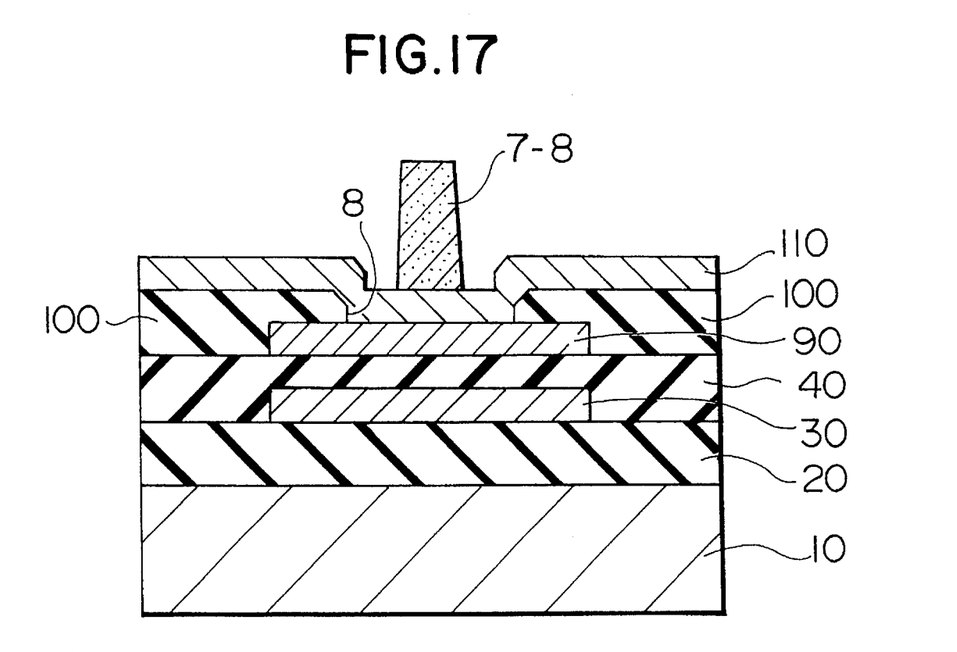
FIGS. 17 and 18 are sectional views respectively showing the third embodiment of the present invention and a modification thereof.
Figure 18:
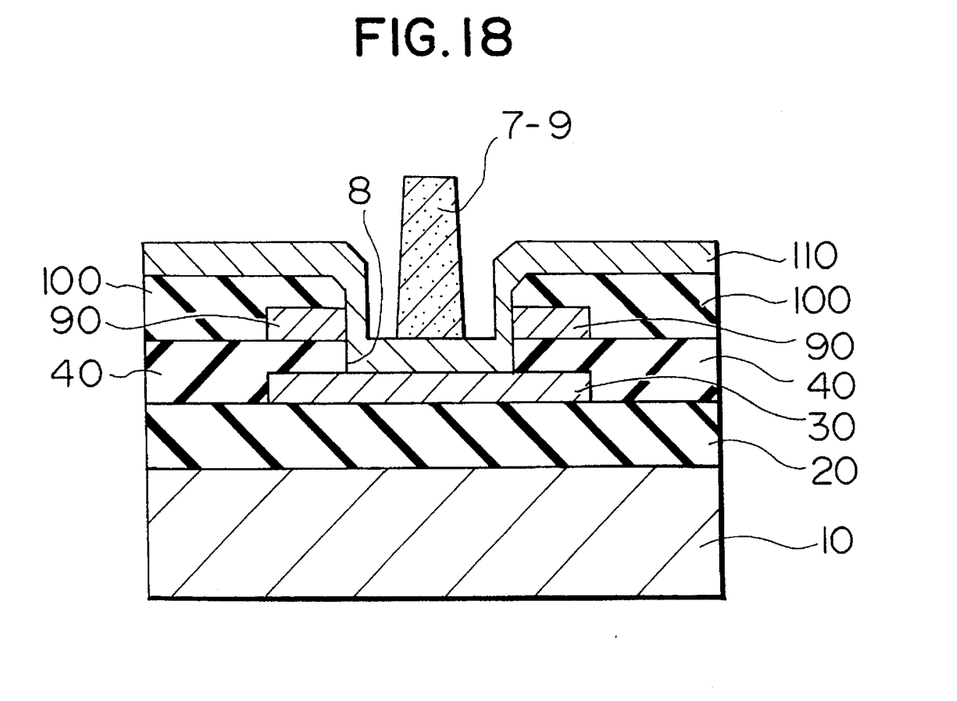

The third embodiment using the present invention will be described below with reference to FIG. 17. FIG. 17 is a longitudinal sectional view of a semiconductor device manufactured upon application of the box pattern described in the second embodiment to a process other than the aluminum process. Reference numeral 10 denotes a silicon semiconductor substrate; 20, a first insulating interlayer consisting of a silicon oxide film formed by a CVD method; 30, a polysilicon film serving as a first wiring layer having a thickness of 100 nm; 40, a silicon oxide film serving as a second insulating interlayer formed by the CVD method; and 90, a tungsten polycide film serving as a second wiring layer constituted by a multilayer of a polysilicon film doped with phosphorus and having a thickness of 100 nm and a tungsten silicide film formed by sputtering and having a thickness of 100 nm. A silicon oxide film (BPSG film) 100 serving as a third insulating interlayer doped with phosphorus and boron is formed on the tungsten polycide film 90 by the CVD method, and a contact hole 8 is formed. Thereafter, a polysilicon film 110 serving as a third wiring layer having a thickness of 100 nm is formed on the entire surface of the resultant structure, and a photoresist film 7-8 for patterning is formed. Also in this case, as in the second embodiment, the contact hole becomes shallow. Hence, the misalignment amount of the photoresist film 7-8 with respect to the contact hole 8 can be accurately checked. In this embodiment (FIG. 17), the polysilicon film 30 is formed under the tungsten polycide film 90 such that both the films have the same size. With the arrangement of the polysilicon film 30 under the tungsten polycide film 90, even if the tungsten polycide film 90 does not serve as an etching stopper in dry etching of the contact hole 8, and the contact hole reaches the silicon oxide film 40, the polysilicon film 30 serves as the second etching stopper (FIG. 18). In this case, an effect for improving the edge shape of a photoresist film 7-9 is slightly degraded as compared to a case wherein the opening of the contact hole is stopped at the tungsten polycide film 90. However, as compared to an alignment accuracy check pattern formed by the conventional method in which neither the tungsten polycide film 90 nor the polysilicon film 30 are present, a misalignment amount can be accurately checked.

In the above first to third embodiments, detailed examples in check of a misalignment amount between the wiring pattern of the aluminum film or the polysilicon film and the contact hole have been described. However, in the present invention, the material of the wiring pattern need not be limited to the aluminum film or the polysilicon film. The present invention can also be applied to a tungsten silicide film or a multilayer of an aluminum film and a titanium nitride film without any problem as long as the material has an etching rate different from that of an insulating film.

What is claimed is:

1. An alignment accuracy check pattern formed in a check pattern formation region where no semiconductor element is formed, comprising:

a semiconductor substrate;

a first insulating interlayer formed on said semiconductor substrate;

a first wiring layer formed on said first insulating interlayer and used for forming a semiconductor element in an element formation region different from said check pattern formation region;

a second insulating interlayer formed on said first wiring layer;

at least one contact hole so formed in said second insulating interlayer as to expose said first wiring layer; and a second wiring layer consisting of an aluminum film, said aluminum film being patterned in said check pattern formation region so as to have a width narrower than that of said contact hole and to be arranged on said first wiring layer to be exposed within said contact hole, said second wiring layer being not electrically connected to any other semiconductor elements.

2. A pattern according to claim 1, wherein said check pattern formation region comprises a plurality of regions where each alignment accuracy check pattern is formed in a specific region for each patterning process, and said first and second wiring layers are formed on an entire surface of a region other than said specific region.

3. A pattern according to claim 1, wherein said first wiring layer is a polysilicon layer.

4. A pattern according to claim 2, wherein said first wiring layer is a polysilicon layer.

\* \* \* \* \*